(12) United States Patent
Shigyo et al.

(10) Patent No.: US 10,967,818 B2
(45) Date of Patent: Apr. 6, 2021

(54) VEHICLE-MOUNTED CONTROL DEVICE

(71) Applicant: Hitachi Automotive Systems, Ltd., Hitachinaka (JP)

(72) Inventors: Toshikazu Shigyo, Ibaraki (JP); Masaru Kamoshida, Ibaraki (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 15/746,034

(22) PCT Filed: Jul. 27, 2016

(86) PCT No.: PCT/JP2016/071951
§ 371 (c)(1),
(2) Date: Jan. 19, 2018

(87) PCT Pub. No.: WO2017/038316
PCT Pub. Date: Mar. 9, 2017

(65) Prior Publication Data
US 2018/0222408 A1    Aug. 9, 2018

(30) Foreign Application Priority Data

Sep. 4, 2015    (JP) .............................. JP2015-174305

(51) Int. Cl.
*B60R 16/023*    (2006.01)
*H05K 5/06*    (2006.01)
(Continued)

(52) U.S. Cl.
CPC ......... *B60R 16/0239* (2013.01); *H02G 3/088* (2013.01); *H02G 3/14* (2013.01);
(Continued)

(58) Field of Classification Search
CPC ........ B60R 16/0239; H02G 3/14; H02G 3/16; H02G 3/088; H05K 5/06; H05K 5/0052; H05K 5/062
See application file for complete search history.

(56) References Cited

U.S. PATENT DOCUMENTS

| 6,407,925 B1 | 6/2002 | Kobayashi et al. |
| 2013/0120943 A1 | 5/2013 | Tamura et al. |

(Continued)

FOREIGN PATENT DOCUMENTS

| JP | S57-20153 U | 7/1982 |
| JP | S60-213095 A | 10/1985 |

(Continued)

OTHER PUBLICATIONS

International Search Report with English translation and Written Opinion issued in corresponding application No. PCT/JP2016/071951 dated Nov. 1, 2016.

(Continued)

*Primary Examiner* — James Wu
*Assistant Examiner* — Hung Q Dang
(74) *Attorney, Agent, or Firm* — Foley & Lardner LLP

(57) ABSTRACT

Provided is an in-vehicle control device which is able to protect a seal material even when being interposed by a fixing member which is fixed to a vehicle while suppressing the protruding of the seal material toward an inner space. The in-vehicle control device includes a first housing (20), a second housing (30) which is fixed to face the first housing (20), and a seal material (40) which seals the inner space which is disposed between a flange of the first housing (20) and a flange of the second housing (30) and is formed by the first housing (20) and the second housing (30). The first housing (20) includes a shape (22) (bank-shaped portion) which is disposed on a side near an inner space (11) from the (Continued)

seal material (40), faces the flange of the second housing (30), and suppresses the moving of the seal material (40) toward the inner space (11).

12 Claims, 6 Drawing Sheets

(51) Int. Cl.
*H02G 3/08* (2006.01)
*H05K 5/00* (2006.01)
*H02G 3/14* (2006.01)
*H02G 3/16* (2006.01)

(52) U.S. Cl.
CPC ............. *H02G 3/16* (2013.01); *H05K 5/0052* (2013.01); *H05K 5/06* (2013.01); *H05K 5/062* (2013.01)

(56) References Cited

U.S. PATENT DOCUMENTS

| | | |
|---|---|---|
| 2013/0271933 A1 | 10/2013 | Tanaka et al. |
| 2014/0076772 A1 | 3/2014 | Azumi et al. |
| 2014/0085839 A1* | 3/2014 | Nakano ................ H05K 5/0052 361/752 |
| 2018/0192526 A1* | 7/2018 | Suzuki .................. H05K 5/069 |

FOREIGN PATENT DOCUMENTS

| | | |
|---|---|---|
| JP | H05-000556 U | 1/1993 |
| JP | H07-237267 A | 9/1995 |
| JP | 2012-227217 A | 11/2012 |
| JP | 2013-062334 A | 4/2013 |
| JP | 2013-222783 A | 10/2013 |
| JP | 2014-060307 A | 4/2014 |
| JP | 2015-002282 A | 1/2015 |

OTHER PUBLICATIONS

Office Action dated Dec. 11, 2018 in Japanese Patent Application No. 2017-537657 with its English translation.
Extended European Search Report dated Mar. 11, 2019 in the corresponding European Patent Application No. 16841348.2.

* cited by examiner

VEHICLE-MOUNTED CONTROL DEVICE

TECHNICAL FIELD

The present invention relates to an in-vehicle control device.

BACKGROUND ART

An in-vehicle control device to be mounted in an engine room is required to have a high attaching flexibility in order not to limit a mounting position into a vehicle. As a general fixing method to a vehicle, a flange is provided in an in-vehicle control device, a through hole is provided in the flange, and the in-vehicle control device is fixed to a fixing member of the vehicle using a bolt. However, in recent years, as a method of simplifying work and not using a bolt for lowering costs, a bracket provided in the vehicle is used to interpose and fix the in-vehicle control device in many cases.

In addition, environment resistance specifications, which are strict to corrosion and degradation, and a long life span are also required. In particular, a long life span against salt resistance such as salt water is required. A seal structure, a seal thickness, a seal length, and a draining performance of salt water are important to avoid development of crevice corrosion.

An increase in size of a housing led by high functionality of the in-vehicle control device and an increase in the number of electrodes of a connector are progressing even more than a technical progression in miniaturization of an electronic component to be mounted in a board and in miniaturization of a mounting structure. A decentralization technique of the in-vehicle control device and a wireless technique to reduce the number of electrodes of the terminal of the connector are not possible to be simply realized in the in-vehicle control device for an engine mounted in the engine room and in the in-vehicle control device for a transmission.

In addition, a housing of the in-vehicle control device is required to be made low and light while the size is increased in order to attribute to fuel efficiency required in a vehicle. Therefore, there is a need to develop a molding technique of a housing of which thickness is small while deformation is suppressed. The electronic component is necessarily made low as well as an aluminum electrolytic capacitor, and a seal structure for waterproof is also necessarily made low together with the electronic component. In particular, as a housing of an electronic control device for an engine to be mounted in the engine room, a high heat dissipating housing is required in which the housing is made thin and also has a radiation performance for a high functionality, and made low and light at a low cost.

Further, a seal material having a long life span used in the engine room is different from a general-purposed material, and thus is generally expensive. A seal length has to be secured while reducing an amount of use of the seal material together with variation in works and assembling processes.

Conventionally, as a seal structure of the in-vehicle control device, there is known a structure which is able to suppress a leakage of the seal material from a junction surface between a case and a cover of the housing while the seal material fills a gap between the junction surfaces regardless of a dimensional tolerance therebetween (for example, see PTL 1).

In addition, there is known a structure in which the seal material is hard to peel in the vicinity of a boundary even in a case where a load is applied from the inside to the seal material in an electronic device in which a connecting portion of the case is sealed by the seal material (for example, see PTL 2).

Further, there is known a structure of a small and cheap housing which is improved in a waterproof seal performance between the case and the cover of the housing in which a circuit board is sealed and stored (for example, see PTL 3).

CITATION LIST

Patent Literatures

PTL 1: JP 2012-227217 A
PTL 2: JP 2015-2282 A
PTL 3: JP 2014-60307 A

SUMMARY OF INVENTION

Technical Problem

In the conventional structure of PTL 1, the seal material fills a gap between the case and the cover, and an outer gap and an inner gap are necessarily filled with the seal material. The seal material moves to overflow toward the inner space, and thus there is a need to prevent the movement of the seal material. Further, since fixation of interposing bracket to the vehicle is not taken into consideration, a fixing method to the vehicle has no flexibility. Even when the interposing bracket (fixing member) is used, there is a need to form a seal structure not to damage the seal portion.

In addition, in the conventional structure of PTL 2, the structure is formed in such a manner that the seal material fills a gap between a first case and a second case, the first case and the second case are received on the outer peripheral side opposite to the inner space, and crevice corrosion caused by electrolytic corrosion progresses on both the first case and the second case since salt water accumulates in a side end portion and a rear end portion of the second case. The outer peripheral side is also necessarily formed in the seal structure.

In addition, in the conventional structure of PTL 3, the seal material fills a gap between the case and the cover, and the salt water accumulates in the portion where the seal material fills since the height of the outer wall of the case is made higher than the portion where the seal material fills. Therefore, there is a need to drain the salt water. Further, an attaching flexibility to the vehicle is not obtained.

In addition, since the seal material fills a gap between a shelf stage of the cover and the case, fixation of interposing bracket to the vehicle is not taken into consideration. Therefore, a fixing method to the vehicle is not flexible. Even when a bracket is used to interpose the in-vehicle control device, there is a need to form a seal structure which does not damage the seal portion. In addition, the seal material flows toward the inner space where the board is stored in the structure.

In addition, since a height position of the board is higher than the height of the seal material to be applied to the case, the height of the electronic component to be mounted in the board is limited if the height of the cover is not made high. Further, the height of the cover becomes high, and the cost is increased.

An object of the invention is to provide an in-vehicle control device which is able to protect the seal material even when the seal material is interposed by a fixing member to be fixed to a vehicle while suppressing the protruding of the seal material toward the inner space.

Solution to Problem

In order to achieve the object, the present invention includes: a first housing; a second housing which is fixed to face the first housing; and a seal material which seals an inner space, the inner space being disposed between a flange of the first housing and a flange of the second housing and formed by the first housing and the second housing, wherein the first housing includes a bank-shaped portion which is disposed on a side near the inner space from the seal material, faces the flange of the second housing, and suppresses the moving of the seal material toward the inner space.

Advantageous Effects of Invention

According to the invention, it is possible to protect a seal material even when the seal material is interposed by a fixing member to be fixed to a vehicle while suppressing the protruding of the seal material toward an inner space. Objects, configurations, and features other than those described above will become clear through the explanation about the following embodiments.

DESCRIPTION OF EMBODIMENTS

Hereinafter, the configurations and operational effects of in-vehicle control devices according to first to fourth embodiments of the invention will be described using the drawings. Further, the same symbols in the respective drawings indicate the same parts.

First Embodiment

Figure 1:
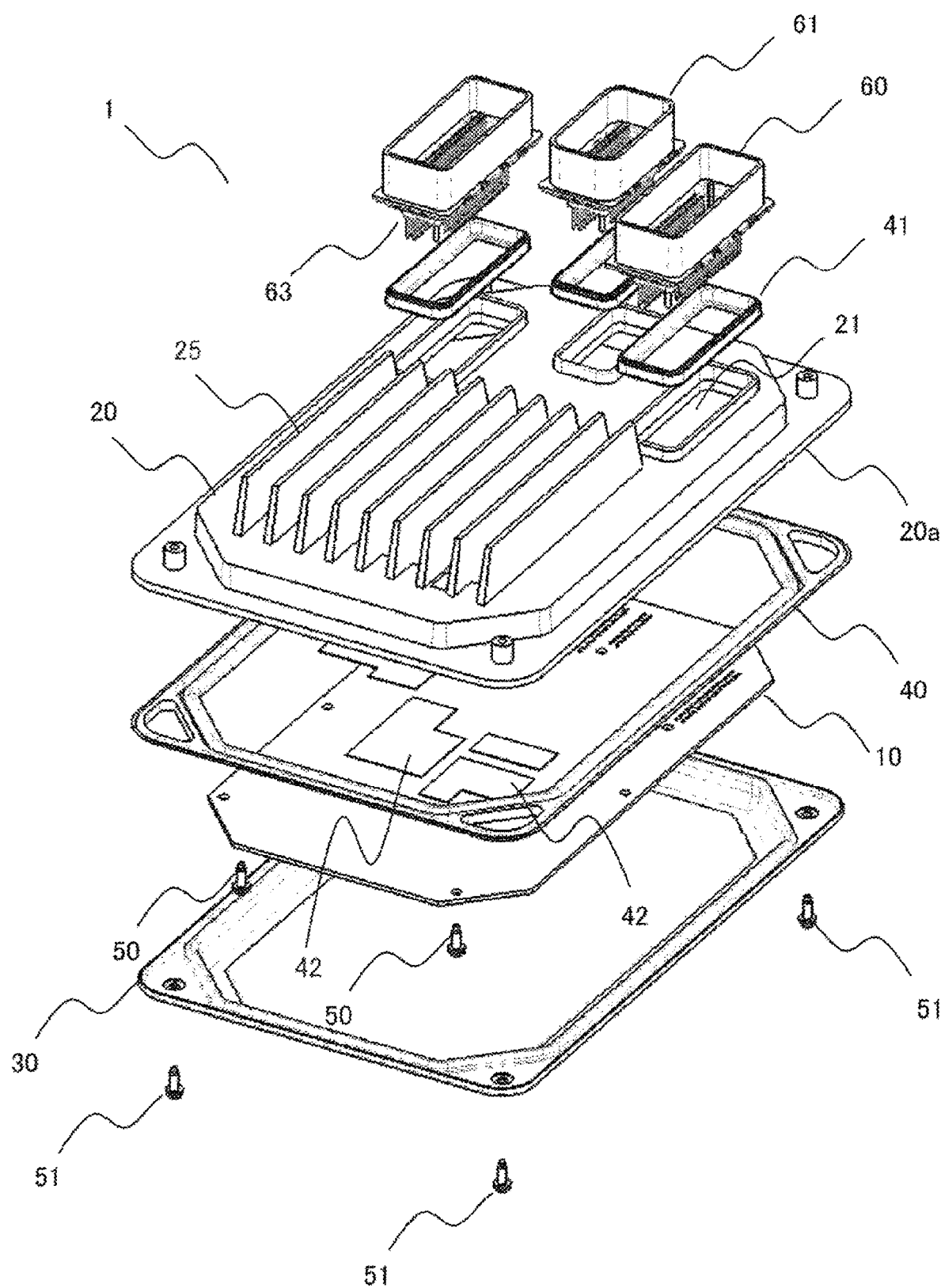
FIG. 1 is a perspective view of an in-vehicle control device according to a first embodiment of the invention.
Figure 2:
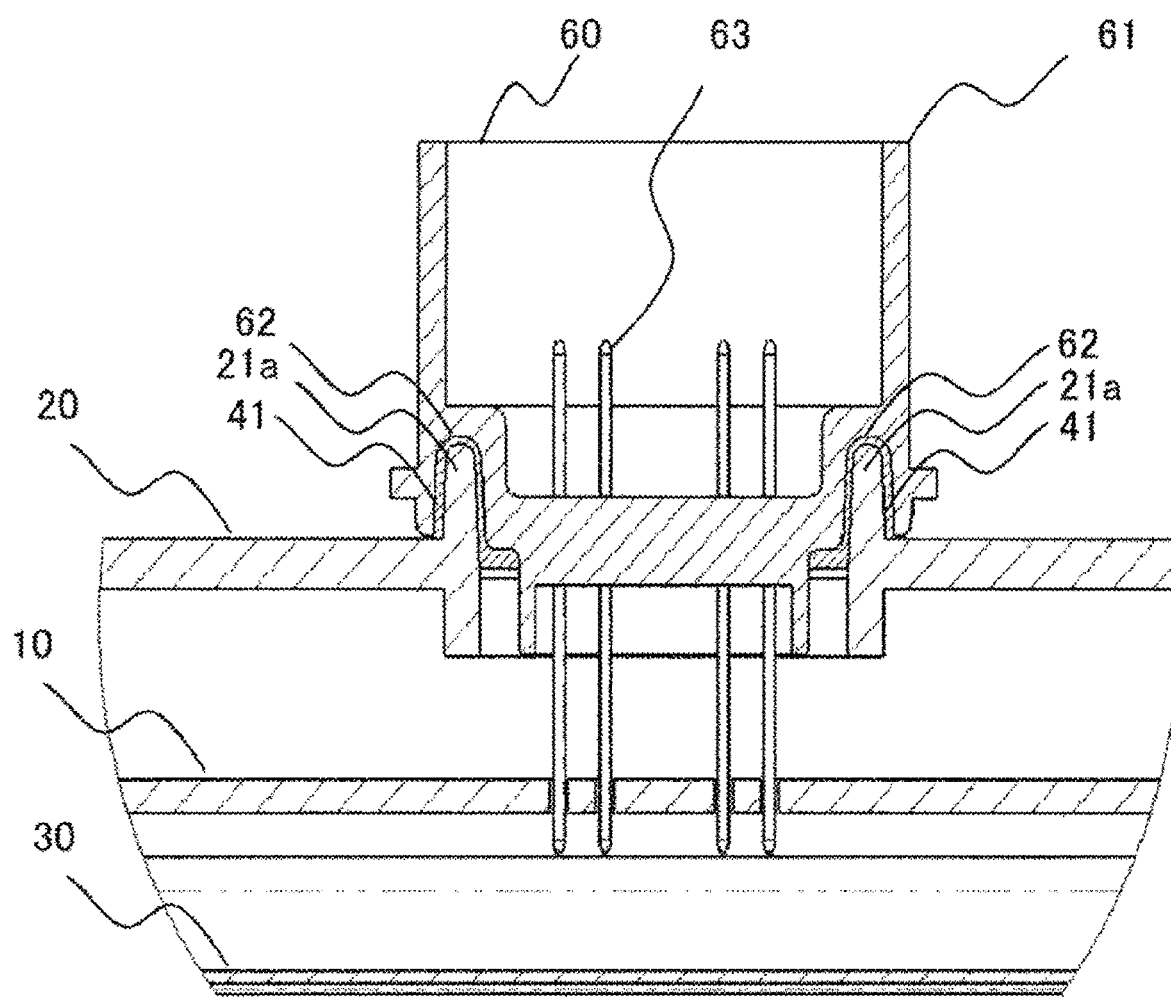
FIG. 2 is a cross-sectional view illustrating main parts of the in-vehicle control device illustrated in FIG. 1.
Figure 3:
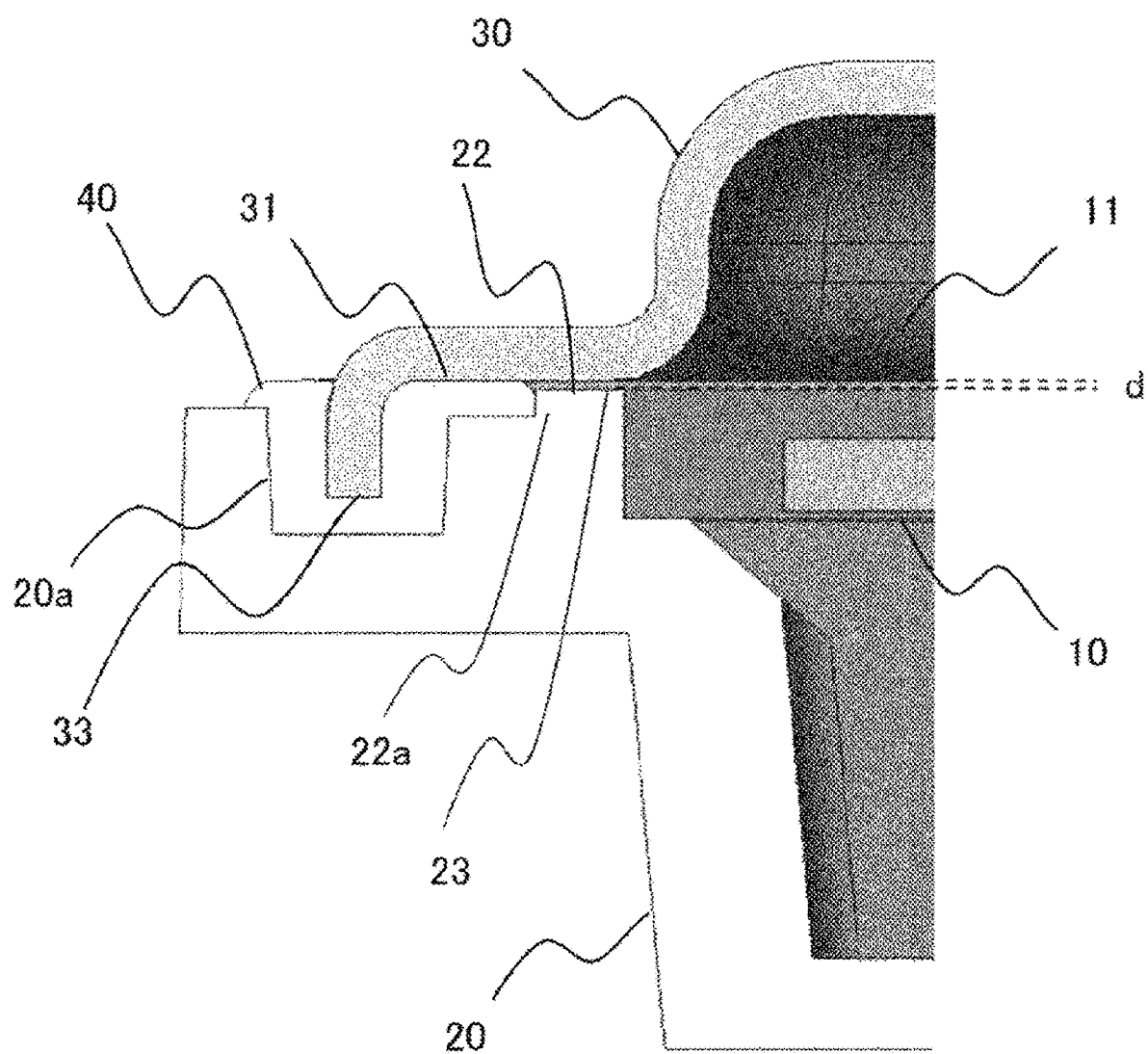
FIG. 3 is a cross-sectional view illustrating main parts of the in-vehicle control device illustrated in FIG. 1.

FIG. 1 is a perspective view illustrating an in-vehicle control device according to a first embodiment of the invention. Electronic components mounted in a board are not illustrated. FIGS. 2 and 3 are cross-sectional views illustrating main parts of a case of the in-vehicle control device according to the first embodiment of the invention.

As illustrated in FIG. 1, an in-vehicle control device 1 is configured by a printed wiring board 10 in which the electronic components (not illustrated) are mounted, a first housing 20 which is used to protect the printed wiring board 10, a second housing 30 (cover) which seals an inner space 11 (FIG. 3) paired with, a connector 60 which is connected to the printed wiring board 10, a seal material 40 which is used for waterproof between the first housing and the second housing, a seal material 41 which is used for waterproof between a housing groove 62 (FIG. 2) of the connector 60 and a convex portion 21a (FIG. 2) surrounding a plurality of openings which pass through the first housing 20, a screw 50 which fixes the printed wiring board 10 to the first housing 20 through a heat-dissipating adhesive 42 between the printed wiring board 10 and the first housing 20, and a screw 51 which fixes the first housing 20 and the second housing 30.

The first housing 20 stores the printed wiring board 10 together with the second housing 30 therein, and protects the printed wiring board 10 with the electronic component mounted therein from water and foreign materials. The first housing 20 is preferably made of metal, and suitably aluminum in order to radiate heat of the electronic component or to shield noises. In particular, the shield effect is obtained in the in-vehicle control device 1 for a direct injection engine.

The first housing 20 is molded by an aluminum die-casting method in which metal is used. In a case where the in-vehicle control device is configured by electronic components which do not need to radiate heat or shield, resin may be used as the material of the first housing 20. In the case of resin, the first housing 20 (case) is molded by an injection molding method.

An external shape of the in-vehicle control device is about 240 mm×160 mm, has a comparatively large size in the in-vehicle control device 1 disposed in an engine room, and has a rectangular shape. The in-vehicle control device disclosed in PTL 3 has a size of about 160 mm×160 mm, and the in-vehicle control device of this embodiment is larger by 1.5 times or more the size of the in-vehicle control device disclosed in PTL 3.

In the first housing 20, an opening 21 is provided to pass through the first housing 20. The opening 21 serves to pass the connector. In the first housing 20, a pressure is applied to the first housing 20 under transportation and usage environments of a vehicle such as an altitude change and a temperature change, and thus the center portion of the first housing 20 is deformed in a direction of regularities (an upward and downward direction of FIG. 1). Therefore, the passing-through opening 21 is preferably formed on the outer side from the center of the case. A radiation fin 25 is formed on the opposite side of the opening 21 to increase a heat capacity. The radiation fin 25 is directed, as illustrated in FIG. 1, to be parallel to the long side of the first housing 20, or may be parallel to the short side of the first housing 20. It is preferable that the radiation fin is parallel to a gate at the time of molding by the aluminum die-casting method.

There are two types of positions of gates at the time of molding by the aluminum die-casting method. As the first position, a position near the short side of the rectangular first housing and the opposite side of the opening 21 is selected to be parallel to the longitudinal direction of the connector 60 and the radiation fin 25, and an overflow position is provided in a surface near the short side of the opposite side of the gate or a surface near the side surface.

In addition, as the second position, the gate is provided near the long side of the rectangular first housing 20, and the overflow is provided near the long side on the opposite side. In a case where the size is large and the shape is rectangular, the molding is necessarily finished in a time when aluminum is solidified. Therefore, the second position of the gate is more preferable in that fluidity can be improved and a casting failure can be reduced. When the fluidity is improved, there can be obtained advantages that the air is prevented from being mixed, defects of an aluminum die cast, such as cavities and welding marks are prevented, the amount of aluminum flowing into the overflow is reduced, and it costs less in molding. When the fluidity deteriorates and the molding defects such as cavities and welding marks occur, a deterioration in thermal conductivity and cracks are caused, and the strength and the external appearance are influenced as well as deformation.

As illustrated in FIG. 3, in the first housing 20, a peripheral groove 20a is provided all around the first housing 20, and a shape 22 is provided on a side near the inner space from the seal material 40 to prevent or suppress the moving of the seal material 40 toward the inner space.

In other words, the first housing 20 includes the shape (bank-shaped portion) 22 which is disposed on a side near the inner space 11 from the seal material 40 and faces the edge (flange) of the second housing 30 to suppress the moving (flowing) of the seal material 40 toward the inner space 11. With this configuration, it is possible to suppress the protruding of the seal material 40 toward the inner space. In addition, even though being interposed by a bracket (fixing member) to be fixed to the vehicle, the shape 22 (bank-shaped portion) comes into contact with the second housing. Therefore, it is possible to protect the seal material 40.

The shape 22 is set to be higher than the peripheral groove 20a. The shape may be formed in a stepped shape 22a as it goes toward the inner space. In the stepped shape 22a, a first flat portion 23 is provided. In other words, the shape 22 (bank-shaped portion) includes the first flat portion 23 which faces the edge (flange) of the second housing 30.

In order to prevent the seal material 40 from moving, the first flat portion 23 is preferably made long to an extent that a casting failure does not occur in the aluminum die-casting method. There is a need to secure clearance such that the shape 22 does not come into contact with the printed wiring board 10. In addition, the first housing 20 is subjected to a shot blasting process to make the surface rough in order to suppress the movement of the seal material 40. In particular, when the peripheral groove 20a where the seal material 40 is applied and the periphery of the shape 22 are increased in surface roughness, the movement of the seal material 40 can be suppressed. The seal material 40 is exposed to the outer side rather than the inner space, and thus crevice corrosion caused by electrolytic corrosion does not occur.

In the first housing 20, there are a plurality of pedestals to fix the printed wiring board 10, and a pedestal subjected to a tapping process to fasten the screw 50 and a pedestal having profile irregularity where the heat-dissipating adhesive member 42 are applied. In the first housing 20, a pedestal to be fixed to the second housing 30 through the screw 51 is also provided.

The second housing 30 is provided with an end portion 33 all around the second housing 30, and the seal material 40 is applied in a gap with the peripheral groove 20a of the first housing 20 for the protection from a foreign material such as salt water which is required in an environmental specification of the engine room.

In other words, the second housing 30 faces the first housing 20 and is fixed to the screw 51. The seal material 40 seals the inner space which is disposed between the flange of the first housing 20 and the flange of the second housing 30, and formed by the first housing 20 and the second housing 30. The first housing 20 includes the peripheral groove 20a which is adjacent to the shape 22 (bank-shaped portion) and is filled with the seal material 40. The second housing 30 includes the end portion 33 which is inserted into the peripheral groove 20a. With this configuration, a waterproof property is improved.

As a material of the cover, a metal-based or aluminum-based steel sheet is preferable, and a resin or aluminum die cast may be used. The metal does not cause an influence of electromagnetic waves. Alternatively, the metal is not affected by electromagnetic waves compared to other materials.

The second housing 30 is preferably made of a steel sheet having an even thickness, and molded by a press molding method. In the case of the steel sheet, it is preferable to use a sheet subjected to plating. The plating is performed using a material such as zinc, aluminum, and magnesium having high corrosion resistance in the engine room environment. In the case of a preliminary plated steel sheet, a cutout surface at the time of molding is not plated. Therefore, the end portion 33 is buried in the seal material 40 to protect the end portion 33 from the corrosion. With the clearance between the end portion 33 and the peripheral groove 20a, a sufficient thickness for keeping an adhesive force of the seal material 40 is secured. A second flat portion 31 is provided on a side near the seal material to be parallel to the first flat portion 23 in order to interpose the seal material 40 together with the first housing 20. In other words, the second housing 30 includes the second flat portion 31 which faces the first flat portion 23.

The end portion 33 is molded by a bending press molding method. The peripheral groove 20a and the end portion 33 are preferably formed in a labyrinth structure. A gap between the first flat portion 23 and the second flat portion 31 becomes narrow, and there is a need to form the gap to prevent the movement of the seal material. In other words, a gap d between the shape 22 (bank-shaped portion) and the second housing 30 is formed. With this configuration, electrolytic corrosion can be prevented for sure.

In the printed wiring board 10, the electronic component is mounted using a conductive alloy such as solder. Both surfaces may be used for the mounting. The electronic component includes a passive component such as a resistor and a capacitor and an active component such as a semiconductor, and is mounted in the printed wiring board by a surface mounting method or an insertion mounting method. It is preferable to adopt the electronic components having a long life span to withstand the engine room environment for a vehicle. As a package of the electronic component, there are QFP (Quad Flat Package) in which a lead terminal is extended, a high density BGA (Ball Grid Array), and a high density QFN (Quad For Non-Lead Package) in order to increase a packaging density. The BGA has semicircular electrodes formed by a surface tension of a conductive alloy connected to terminals arranged in a lattice in a package bottom, and is bonded to the printed wiring board 10 by reflow. The QFN has a short terminal compared to the QFP, and is connected to the printed wiring board 10 by the conductive alloy. When a deformation amount of the printed wiring board 10 is large, the bonding portion is structurally easy to stress. Therefore, there is a need to suppress a deformation amount of the printed wiring board 10.

As illustrated in FIG. 1, the printed wiring board 10 is fixed to the pedestal, which is formed by a tapping process, of the first housing 20 together with a plurality of screws 50. In this case, the printed wiring board 10 and the pedestal having the profile irregularity of the first housing 20 are fixed to interpose the heat-dissipating adhesive 42, so that the heat of the electronic component is thermally conducted to the pedestal through a via of the printed wiring board and is transferred through the surface of the first housing 20 including a fin.

A height position of the printed wiring board 10 is preferably at the center between the first housing 20 and the second housing 30. When the position is shifted to any direction, the height of the mounting electronic component is limited, and a tall electronic component is not able to be disposed in both surfaces. In addition, the in-vehicle control device 1 can be made low in height by disposing the height position of the printed wiring board 10 at the center between the first housing 20 and the second housing 30. By making the in-vehicle control device 1 low in height, it is possible to easily secure mounting space in the engine room, and to easily receive wind for cooling down.

The in-vehicle control device 1 of this embodiment has a relatively large size in the in-vehicle control device which is disposed in the engine room. Therefore, four to seven screws are used for fixation. The screws 50 are preferably positioned to be equally away from each other while considering a layout of four corners of the printed wiring board 10 and the electronic components. In particular, the printed wiring board 10 in the vicinity of the screw 50 is distorted. Therefore, it is preferable to dispose the electronic component not to cause distortion in the connector 60 and a contact portion of the conductive alloy of the BGA and the QFN, and thus the disposing in the vicinity is not preferable. In addition, the screw 50 has a function of a case ground, and is electrically connected to the first housing 20 through a GND wiring pattern of the printed wiring board 10 and the screw 50. The case ground preferably leads the wiring pattern of the printed wiring board 10, and is placed at the four corners of the printed wiring board 10.

The printed wiring board 10 is preferably a glass epoxy board which is made of layered glass fiber clothes impregnated with an epoxy resin, and is a multilayered board in which an insulator and a pattern are overlapped by 4 to 6 layers because a high density mounting is required. In addition, a through wiring board in which the layers are wired via through holes or a build-up board made by a build-up method is preferable.

The heat-dissipating adhesive 42 transfers the heat of the electronic component to the pedestal having the profile irregularity of the first housing 20 through a via of the printed wiring board. The heat is easily transferred as a thickness of the heat-dissipating adhesive 42 is thinner. When the first housing 20 is deformed in a normal direction (the upper side of FIG. 1), the clearance with respect to the printed wiring board 10 is widened. Therefore, the heat-dissipating performance is worsened, and thus it is effective to suppress the deformation of the first housing 20. The electronic component of which the heat is necessarily radiated is disposed below the radiation fin 25.

The connector 60 is configured by a housing 61, a terminal 63, and a potting material (not illustrated).

The terminal 63 is press-molded using a high thermal conductivity copper. The shape of the terminal 63 is straight, and is provided with a crushing portion at the end to be easily led into the connector on a harness side or a through hole of the printed wiring board. The housing 61 is made of resin by an injection molding method, and pressed fit into the terminal 63. Alternatively, the housing may be inserted and molded at the same time with the terminal 63. The potting material is provided for the purpose of sealing a gap between the housing 61 and the terminal 63.

The size of the connector 60 depends on the number of electrodes of the terminal 63 and a width of the terminal 63.

The terminal 63 is configured by about 60 to 80 electrodes in total including signal terminals and power terminals depending on a current capacity. The power terminal is formed to have a wider width. The terminal 63 and the through hole of the printed wiring board 10 are connected using a conductive alloy (not illustrated) such as solder. In addition, a press fit terminal (not illustrated) may be used for the mechanical and electrical connection.

In the first embodiment, there are provided three connectors 60, but the number is not limited to "three" and may be "three or more". Three or more openings 21 of the first housing are provided in accordance with the number of connectors. The connector 60 at the center is disposed on the outermost side, so that it is possible to increase the mounting area of the electronic component. In addition, the wiring pattern of the printed wiring board is also not dense, and it can also be avoided that the pattern wirings are overlapped.

The connector 60 of the first embodiment is assembled in such a manner that the connector 60 is connected to the outer side of the opening 21 of the first housing 20 through the seal material 41. However, the connector may be connected to the inner surface side of the opening 21 of the first housing 20 through the seal material 41 after being first connected to the printed wiring board 10. When the connector 60 is connected from the outer side of the opening 21 of the first housing 20, there is an advantage that a sealing structure of the connector 60 is miniaturized.

Regarding the connecting method of the connector 60 to the first housing 20 in detail, the housing groove 62 (FIG. 2) where the seal material 41 is buried is provided around the housing bottom of the connector 60, the convex portion 21a of the opening of the first housing 20 is fitted, and the seal material 41 is cured and sealed. A labyrinth structure is formed to have the depth of the housing groove 62 and the height of the convex portion 21a of the opening of the first housing, and the protection from a foreign material such as salt water is achieved which is required in an environmental specification of the engine room. Since the seal material 41 fills the housing groove 62 and the clearance of the convex portion 21a of the opening of the case, the amount of clearance and the seal material 41 is determined in consideration of an assembly error. For example, when the inner portion of the first housing 20 is expanded due to an influence of heat and pressure and the surrounding portion of the connector of the first housing is deformed in a normal direction (the upper side of FIG. 2), the seal material 41 serves as a buffering material. However, since the clearance is small, the connector 60 is also deformed at the same time. The deformation of the connector 60 affects also on the terminal 63, and thus the printed wiring board 10 is also deformed through a conductive adhesive at the same time.

As the seal material 41, a silicon adhesive having heat resistance, water resistance, chemical resistance, and flexibility is suitable for the protection from a foreign material such as salt water which is required in an environmental specification of the engine room.

As the seal material 40, a silicon adhesive is suitable similarly to the seal material 41. In particular, when the pressure in the first housing 20 is changed due to a temperature change, an internal pressure is applied onto the first housing 20 and the center of the first housing 20 is bent and deformed in a normal direction (the upper side of FIG. 1), and thus the center of the long side of the first housing 20 is most deformed. Therefore, the seal material 40 has an adhesive force to endure such a deformation.

The second housing 30 is provided with holes at four corners through which the screws 51 pass to be fixed to the first housing 20. The second housing 30 and the first housing 20 are fixed by the screws 51 together with the seal material 40. The screws 51 are preferably disposed at four corners in order not to complicate an application locus of the seal material 40. In this embodiment, since the in-vehicle control device is larger by 1.5 times the size compared to a conventional in-vehicle control device, a thin material is chosen for the second housing 30. However, a rib, a dimple, or a step is provided to secure strength.

According to this embodiment, it is possible to provide a seal structure of the in-vehicle control device which is excellent in environment resistance such as salt water compared to a conventional electronic control device, has a shape to suppress the movement of the seal member toward the inner space, and suppresses the protruding of the seal material toward the inside.

As described above, according to this embodiment, it is possible to protect the seal material even when the seal material is interposed between the fixing members to be fixed to the vehicle while suppressing the protruding of the seal material toward the inner space.

Second Embodiment

Figure 4:
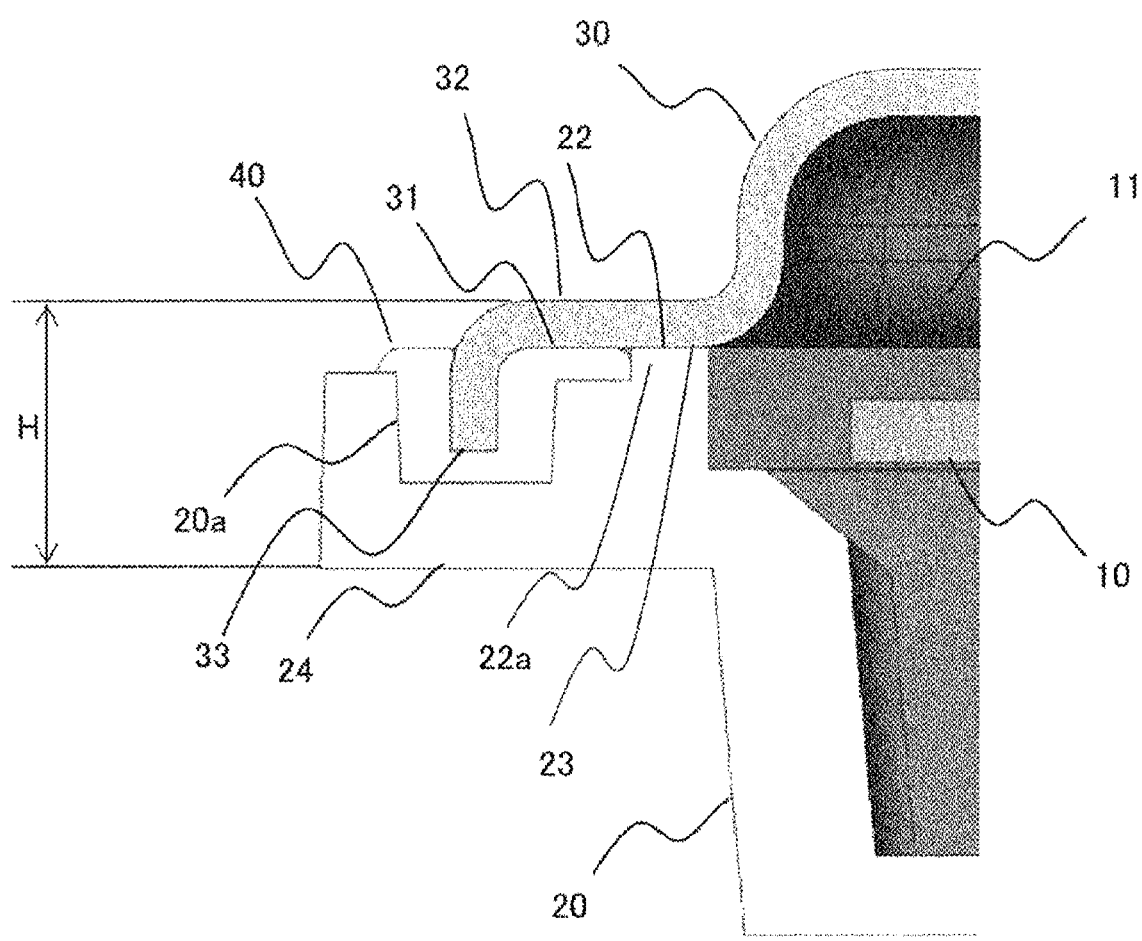
FIG. 4 is a cross-sectional view illustrating main parts of an in-vehicle control device according to a second embodiment of the invention.

FIG. 4 is a cross-sectional view illustrating main parts of an in-vehicle control device according to a second embodiment of the invention. As illustrated in FIG. 4, at least parts of the first flat portion 23 of the first housing 20 and the second flat portion 31 of the second housing 30 come into contact on the inner space side from the seal material 40. In other words, the shape 22 (bank-shaped portion) abuts on the second housing 30. With this configuration, it is possible to prevent the seal material 40 from moving toward the inner space. In addition, it is also possible to protect the seal material by interposing the seal material by a bracket (fixing member) which is fixed to the vehicle.

In addition, a third flat portion 24 is provided on the opposite side of the first flat portion 23 of the first housing 20, and a fourth flat portion 32 is provided on the opposite side of the second flat portion of the second housing 30. When a distance between the third flat portion 24 and the fourth flat portion 32 is set to be a height "H", a dimension of the height H is determined for sure without depending on the height of the seal material 40 even when there is a variation in the amount of applying the seal material 40. When the metals come into contact to each other, there is obtained a seal structure which does not damage the seal material 40.

According to this embodiment, it is possible to provide a seal structure of an in-vehicle control device which is excellent in environment resistance such as salt water compared to a conventional electronic control device, has a shape to prevent the movement of the seal member toward the inner space, prevents the seal material from protruding toward the inner side, and does not damage the seal material.

Third Embodiment

Figure 5:
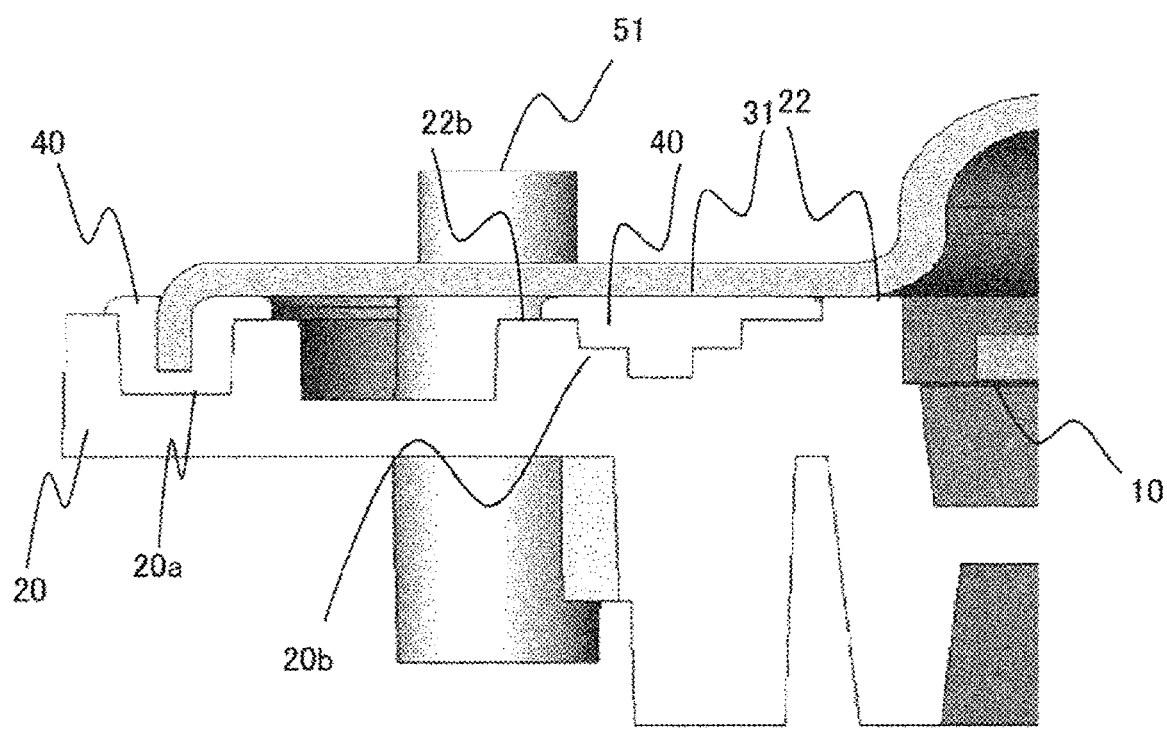
FIG. 5 is a cross-sectional view illustrating main parts of an in-vehicle control device according to a third embodiment of the invention.

FIG. 5 is a cross-sectional view illustrating main parts of an in-vehicle control device according to a third embodiment of the invention. FIG. 5 illustrates the vicinity of the screw 51 which fixes the first housing 20 and the second housing 30. In order to make the screw 51 waterproof, a screw surrounding groove 20b is provided in the first housing 20. A stepped shape 22b which is lower than the shape 22 is provided on the outer side of the screw surrounding groove 20b. The seal material 40 is applied in the screw surrounding groove 20b at four corners, and the screw surrounding groove 20b is preferably formed in a stepped shape in order to secure a seal length.

In other words, the screw surrounding groove 20b has a stepped shape. With this configuration, the seal length becomes long, and the waterproof property of the portion where the seal material 40 and the screw surrounding groove 20b abut is improved. The in-vehicle control device is provided with the screw 51 (fastening member) which fastens the first housing 20 and the second housing 30. The shape 22 (bank-shaped portion) is disposed on the inner space side from the screw 51. With this configuration, it is possible to suppress the protruding of the seal material 40 toward the inner space. In addition, with the fastening force of the screw 51, it is possible to suppress that the seal material 40 is damaged.

In addition, there is also a need to secure a sufficient seal length by the seal material 40 on a side near the second flat portion 31 of the second housing 30. In a case where too much seal material 40 is applied, the seal material 40 may protrude between the peripheral groove 20a and the screw surrounding groove 20b.

According to this embodiment, it is possible to provide a seal structure of an in-vehicle control device which is excellent in environment resistance such as salt water compared to a conventional electronic control device, has a shape to suppress the movement of the seal member toward the inner space, prevents the seal material from protruding to the inner side, and does not damage the seal material.

Fourth Embodiment

Figure 6:
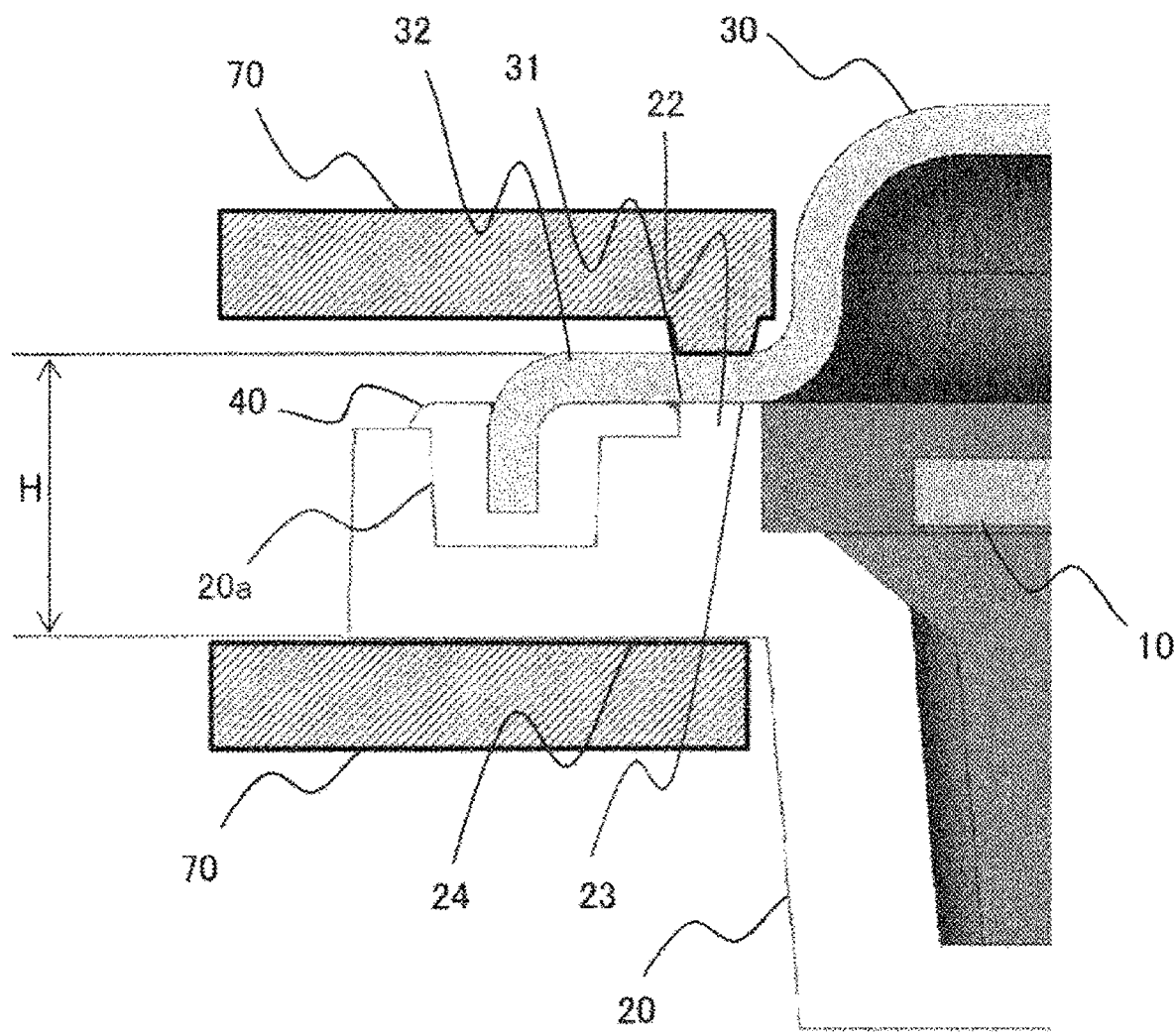
FIG. 6 is a cross-sectional view illustrating main parts of an in-vehicle control device according to a fourth embodiment of the invention.

FIG. 6 is a cross-sectional view illustrating main parts of an in-vehicle control device according to a fourth embodiment of the invention. As illustrated in FIG. 6, a fixing member 70 such as a bracket of the vehicle can be fixed to the third flat portion 24 of the first housing 20, and to the fourth flat portion 32 on the rear side of the second flat portion 31 of the second housing 30. Since there are provided with the third flat portion 24 and the fourth flat portion 32, the in-vehicle control device 1 can be fixed to be interposed by the fixing member 70 over the entire periphery or partially. The in-vehicle control device 1 can also be fixed to the fixing member 70 while sliding. Since there is no interference with the fixing member 70, the outer wall of the peripheral groove 20a is preferably made lower than the height H, and a draining performance is high since there is no place where the salt water accumulates. In addition, the amount of the seal material 40 is adjusted such that the protruding height of the seal material 40 toward the outer side is equal to or less than the height H. The fixing member 70 may be made of a resin or a steel sheet. Similarly to a snap fitting, the first flat portion 23 and the second flat portion 31 have a narrow gap therebetween or come into contact even when an interposing force of the fixing member 70 is strong. Therefore, it is possible to provide a seal structure which does not damage the seal material 40.

Herein, the shape 22 (bank-shaped portion) is disposed between a portion of the first housing 20 abutting on the fixing member 70 which interposes the in-vehicle control device to be fixed to the vehicle, and a portion of the second housing 30 abutting on the fixing member 70. With this configuration, even when being interposed by the fixing member 70, the shape 22 (bank-shaped portion) comes into contact with the second housing, so that it is possible to protect the seal material 40.

According to this embodiment, it is possible to provide an in-vehicle control device which is excellent in environment resistance such as salt water compared to a conventional electronic control device, has a shape to suppress the movement of the seal member toward the inner space, prevents the protruding of the seal material toward the inner side, and has a high attaching flexibility depending on a fixing method of the vehicle without damage on the seal material.

Further, the invention is not limited to the above embodiments, and various modifications can be made. For example, the embodiments are described in a clearly understandable way for the invention, and thus the invention is not necessarily to provide all the configurations described above. In addition, some configurations of a certain embodiment may be replaced with the configurations of another embodiment, and the configuration of the other embodiment may also be added to the configuration of a certain embodiment. In addition, additions, omissions, and substitutions may be made on some configurations of each embodiment using other configurations.

In the above embodiment, the peripheral groove 20a is provided in the first housing 20, and the end portion 33 which is inserted into the peripheral groove 20a is provided in the second housing 30. However, the end portion 33 may be provided in the first housing 20, and the peripheral groove 20a may be provided in the second housing 30.

The embodiments of the invention may be the following aspects.

(1) An in-vehicle control device including:
a plurality of housings; and
a seal member which is provided between the plurality of housings to seal an inner space formed by the plurality of housings,
in which at least one of the plurality of housings is provided on a side near the inner space from the seal member to have a shape to suppress the moving of the seal member toward the inner space.

(2) The in-vehicle control device according to (1),
in which the in-vehicle control device includes a board in which an electronic component is mounted,
in which the plurality of housings include a first housing, and a second housing which pairs up with the first housing to form the inner space to store the board, and
in which the seal member is provided between the first housing and the second housing.

(3) The in-vehicle control device according to (2),
in which the seal member is provided in all the peripheral portion between a first flat portion provided around the first housing and a second flat portion provided around the second housing.

(4) The in-vehicle control device according to any one of (2) and (3),
in which the shape is formed such that a gap between the plurality of housings where the seal member is provided is narrow on a side near the inner space compared to the outer side of the plurality of housings.

(5) The in-vehicle control device according to (4),
in which the shape is formed in a stepped shape in which a portion on a side near the inner space is narrow compared to the outer side of the plurality of housings.

(6) The in-vehicle control device according to any one of (2) and (3),
in which the shape is formed by surface treatment of the plurality of housings.

(7) The in-vehicle control device according to (4),
in which at least a part of the plurality of housings comes into contact on a side near the inner space from the seal member.

(8) The in-vehicle control device according to (4),
in which a gap between the plurality of housings is narrow in a place interposed by a fixing member of a vehicle compared to other places.

(9) A housing for an in-vehicle control device which stores a board in which an electronic component is mounted, including:
a plurality of housings,
in which at least one of the plurality of housings has a shape in which a gap between the plurality of housings is narrow on a side near an inner space compared to the outer side of the plurality of housings.

REFERENCE SIGNS LIST 1 in-vehicle control device
10 printed wiring board
11 inner space
20 first housing
20a peripheral groove
20b screw surrounding groove
21 opening
21a convex portion of opening
22 shape
22a stepped shape
22b low stepped shape
23 first flat portion
24 third flat portion
25 radiation fin
30 second housing
31 second flat portion
32 fourth flat portion
33 end portion
40 seal material
41 seal material
42 heat-dissipating adhesive
50 screw
51 screw
60 connector
61 housing
62 housing groove
63 terminal
70 fixing member
H height

The invention claimed is:

1. An in-vehicle control device, comprising:
a first housing;
a second housing which is fixed to face the first housing and spaced apart from the first housing in a vertical direction to form a groove; and
a seal material which seals an inner space, the inner space being disposed between a flange of the first housing and a flange of the second housing and formed by the first housing and the second housing, wherein
the first housing comprises
a first bank-shaped portion which is set at a first height and is disposed on an inner side of the first housing near the inner space from the seal material, faces the flange of the second housing, and suppresses the moving of the seal material toward the inner space, and
a second bank-shaped portion which is set at a second height lower than the first height and is disposed on an outer side of the first housing from the seal material, wherein at least a portion of the second bank-shaped portion faces away from the flange of the second housing, wherein the seal material fills the inner space to a third height higher than the second height, the seal material extending beyond the inner space to fill an entirety of the groove between the first housing and the second housing and to cover at least a portion of an outer peripheral edge of the flange of the first housing and an outer peripheral edge of the second housing, the first bank-shaped portion is disposed between a third flat portion formed on an outer peripheral side of the first housing and a fourth flat portion formed on an outer peripheral side of the second housing, the flange of the first housing projects from an outer side surface of the first housing, the flange of the second housing projects from an outer side surface of the second housing, the first bank-shaped portion at least partially overlaps with at least the third flat portion in a horizontal direction, the third flat portion and the fourth flat portion being spaced apart in a vertical direction orthogonal to the horizontal direction, wherein an entirety of the first bank-shaped portion is contained in an area between the third flat portion and the fourth flat portion in the vertical direction, the third flat portion and the fourth flat portion are configured to be fixed to a fixing member of a vehicle, and a gap communicating with the inner space formed between the first bank-shaped portion and the second housing, the gap providing a clearance in the vertical direction between the first bank-shaped portion and the second housing and a clearance in the horizontal direction between the seal material and the inner space.

2. The in-vehicle control device according to claim 1, wherein the first bank-shaped portion partially abuts on the second housing.

3. The in-vehicle control device according to claim 1, wherein the first bank-shaped portion includes a first flat portion which faces the flange of the second housing.

4. The in-vehicle control device according to claim 3, wherein the second housing includes a second flat portion which faces the first flat portion.

5. The in-vehicle control device according to claim 1, wherein the first housing or the second housing includes an end portion which is inserted into the groove.

6. The in-vehicle control device according to claim 1, wherein the groove has a stepped shape.

7. The in-vehicle control device according to claim 1, further comprising:
a fastening member which fastens the first housing and the second housing,
wherein the first bank-shaped portion is disposed on a side near the inner space from the fastening member.

8. The in-vehicle control device according to claim 1, wherein the first bank-shaped portion is disposed between a portion of the first housing abutting on a first portion of a fixing member which interposes the in-vehicle control device to be fixed to a vehicle and a portion of the second housing abutting on a second portion of the fixing member.

9. The in-vehicle control device according to claim 1, wherein at least part of the first bank-shaped portion is formed to coincide with the flange of the first housing in the horizontal direction, and the second bank-shaped portion is separated from the second housing.

10. The in-vehicle control device according to claim 4, wherein the clearance in the vertical direction is provided between the first flat portion of the first bank-shaped portion and the second flat portion of the second housing.

11. The in-vehicle control device according to claim 1, wherein the gap suppresses contact of the seal material with the inner space.

12. The in-vehicle control device according to claim 1, wherein the third height is set higher than both the first height and the second height.

* * * * *